(12) United States Patent
Bandi et al.

(10) Patent No.: US 10,110,210 B2
(45) Date of Patent: Oct. 23, 2018

(54) APPARATUS AND METHOD FOR STROBE CENTERING FOR SOURCE SYNCHRONOUS LINKS

(71) Applicant: Intel Corporation, Santa Clara, CA (US)

(72) Inventors: Chenchu Punnarao Bandi, Bayan Lepas (MY); Amit Kumar Srivastava, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/382,155

(22) Filed: Dec. 16, 2016

(65) Prior Publication Data

US 2018/0175839 A1 Jun. 21, 2018

(51) Int. Cl.
| | |
|---|---|
| *H03L 7/06* | (2006.01) |
| *H03K 5/14* | (2014.01) |
| *H03L 7/081* | (2006.01) |
| *H03L 7/091* | (2006.01) |
| *H03K 5/00* | (2006.01) |

(52) U.S. Cl.
CPC ............. *H03K 5/14* (2013.01); *H03L 7/0818* (2013.01); *H03L 7/091* (2013.01); *H03K 2005/00286* (2013.01)

(58) Field of Classification Search
CPC ......................................................... H03K 5/14
See application file for complete search history.

(56) References Cited

U.S. PATENT DOCUMENTS

| | | | | |
|---|---|---|---|---|
| 2004/0125905 | A1* | 7/2004 | Vlasenko | H03L 7/0814 375/376 |
| 2007/0070731 | A1* | 3/2007 | Choi | G11C 7/1051 365/194 |
| 2008/0062809 | A1* | 3/2008 | Lee | G11C 7/22 365/233.1 |

* cited by examiner

*Primary Examiner* — Daniel Puentes
(74) *Attorney, Agent, or Firm* — Schwegman Lundberg & Woessner, P.A.

(57) ABSTRACT

Some embodiments include apparatuses and methods of using the apparatuses. One of the apparatuses includes a data path to receive data information based on timing of a data capture clock signal, a clock path including a delay circuit to apply a time delay to an input clock signal and generate a delayed clock signal, a clock tree circuit to provide the data capture clock signal and a first feedback clock signal based on the delayed clock signal, a circuitry including latches to sample the input clock signal based on timing of the feedback clock signal and provide sampled information, and a controller to control the delay circuit based on the sampled information in order to cause the data capture clock signal to be out of phase with the input clock signal by one-fourth of a period of the input clock signal.

21 Claims, 9 Drawing Sheets

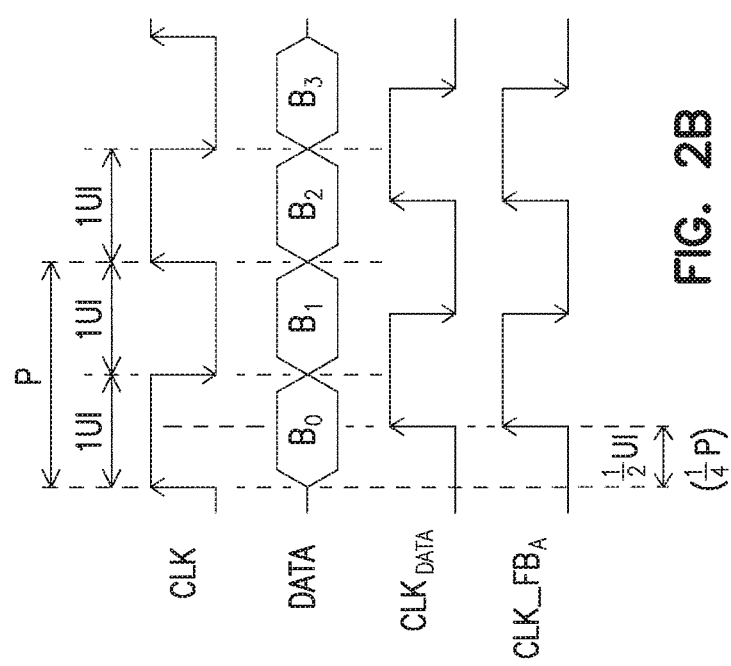

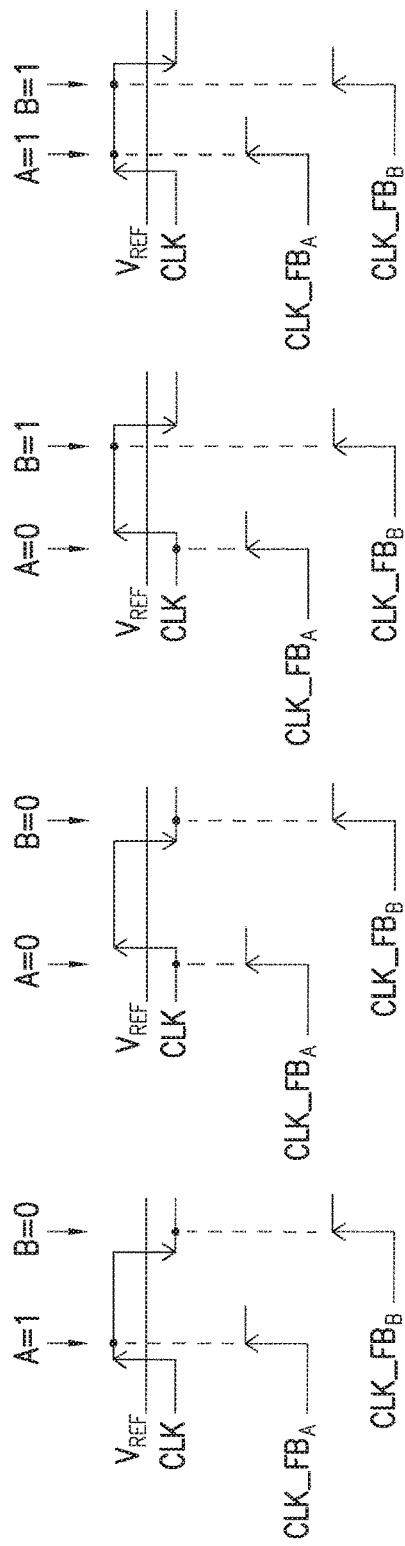

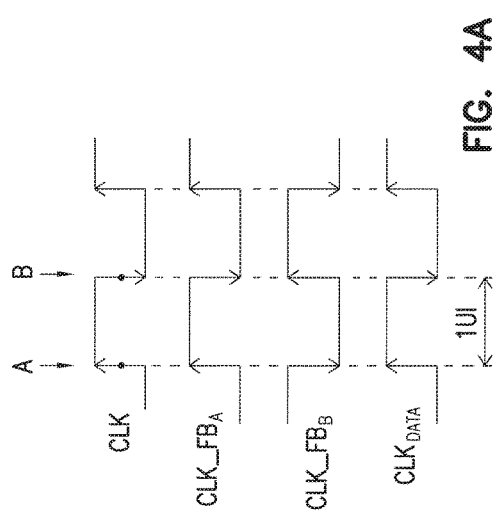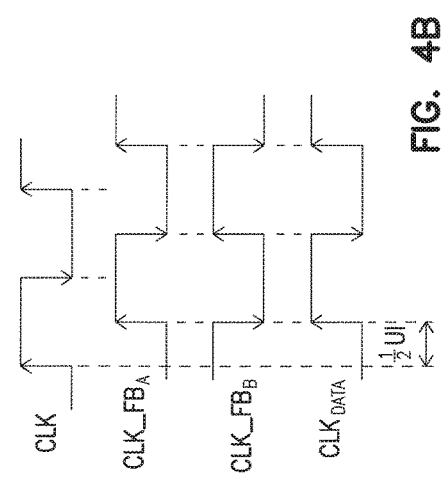

APPARATUS AND METHOD FOR STROBE CENTERING FOR SOURCE SYNCHRONOUS LINKS

TECHNICAL FIELD

Embodiments described herein pertain to signal transmission between devices in electronic systems. Some embodiments relate to control of clock timing in devices of such systems.

BACKGROUND

Many electronic systems (e.g., computers, cellular phones, digital televisions, etc.) use a source synchronous technique to transmit data information between devices in the system. The source synchronous technique uses timing of a clock signal to transmit bits of data information from a transmitting device to a receiving device, such that the edges (rising or falling edges, or both) of the transmitted clock signal are aligned with boundaries (e.g., edges) of a data signal that represent bits of the data information. In some of these systems, the receiving device includes a clock path to generate a clock signal based on the transmitted clock signal. The receiving device also includes a data path to capture the data information based on timing of the generated clock signal. In some of these devices, mismatches in timing (e.g., setup and hold times) between the components of the data and clock paths and variations in operating conditions (e.g., voltage and temperature) may occur. This can lead to inaccuracy in capturing the transmitted data information.

BRIEF DESCRIPTION OF THE DRAWINGS

FIG. 2B is a timing diagram showing timing relationships among clock signals and data information of FIG. 2A, according to some embodiments described herein.

FIG. 3A through FIG. 3D show different possible combinations (e.g., outcomes) of values of sampled information of the device of FIG. 2A during a calibration (e.g., an initial clock-centering operation) of the device, according to some embodiments described herein.

FIG. 4A shows timing relationships among clock signals of the device of FIG. 2A when values of sampled information of the device are converged during an initial clock centering operation of the device, according to some embodiments described herein.

FIG. 4B shows timing relationships among clock signals of the device of FIG. 2A after a controller of the device causes a data capture clock signal to be ½ nit interval (UI) out of phase with an input clock signal according to some embodiments described herein.

DETAILED DESCRIPTION

The techniques described herein include real-time calibration of circuitry (e.g., a DLL) that generates clock signals based on which a data capture clock signal is provided to capture data information (e.g., bits of data) received at a data path. Some conventional systems may generate a clock signal (generated clock signal) based on an input clock signal to capture data information at a data path. Such conventional systems may control timing of the generated clock signal by controlling a timing relationship between a reference clock signal and a feedback clock signal (which is generated based on the input clock signal). However, many factors may reduce timing margins between the generated clock signal and the windows to capture the data information. The reduced timing margins may lead to inaccuracy in capturing of the data information. An example of such factors includes mismatches in timing (e.g., setup and hold time) of components (e.g., data latches) of the data path and timing of components (e.g., receiver and phase detector) of circuitry (e.g., a clock path) that generates timing for the generated clock signal. Another example of such factors includes variations in process, voltage, and temperature (PVT). Further, timing errors in these systems can get worse at a relatively higher data rate and wider variations in PVT, making it harder to design solutions to correct such timing errors.

Some other conventional systems may add dummy components in the system to counter mismatches between components of data and clock paths. However, in these systems, extensive simulations may need to be performed. Plus, the actual product may not behave as expected due to variations in fabricating process and variations in characteristics of channels that carry data information and clock signals between devices in these systems.

The techniques described herein include circuitry (e.g., a DLL) and calibration operations that can prevent or mitigate timing errors suffered by conventional systems. The described techniques can also compensate for variations in PVT in order to maintain a timing relationship between data information and a clock signal (e.g., a data capture clock signal) used to capture the data information. The described techniques can improve timing margins between the data capture clock signal and windows to capture the data information, thereby improving the accuracy of the captured data information over some conventional techniques. Other improvements and benefits of the described technique are discussed below.

Figure 1A:
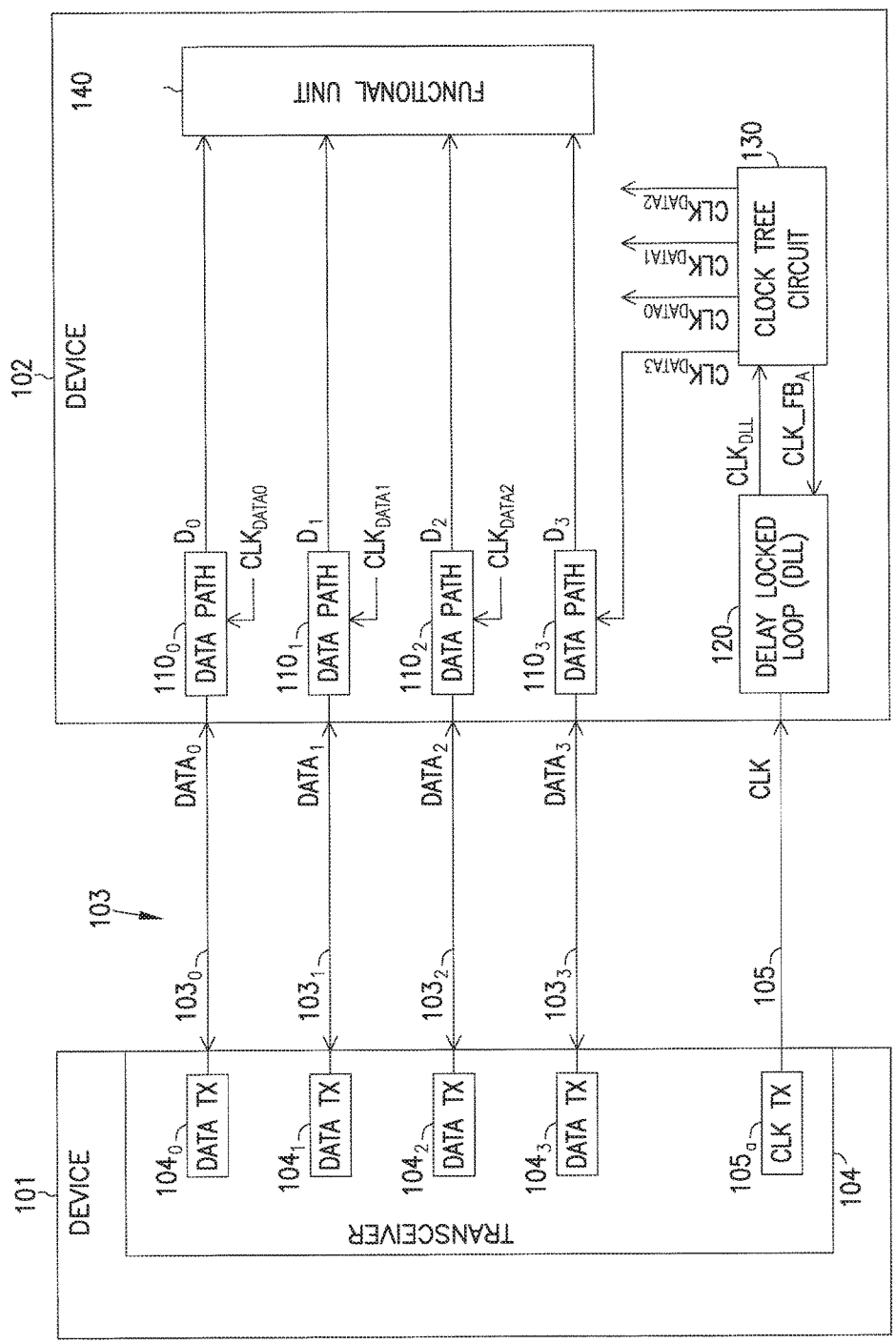
FIG. 1A shows an apparatus including devices and a connection between the devices, according to some embodiments described herein.

FIG. 1A shows an apparatus 100 including devices 101 and 102, and a connection 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems. Each of devices 101 and 102 can include an integrated circuit (IC), such as an IC chip. Devices 101 and 102 can include a combination of a controller (e.g., processors (e.g., central processing unit (CPU)), input/output (I/O) controllers, or memory controller), a memory device, and/or other electronic devices. For example, device 101 can be a CPU and device 102 can be a memory device or vice versa.

Connection 103 can provide communication (e.g., in the form of signal transmission) between devices 101 and 102. Connection 103 can include a bus having links 103$_0$, 103$_1$, 103$_2$, 103$_3$, and 105 to conduct signals between devices 101 and 102. Connection 103 can include a source synchronous connection, such that links 103$_0$, 103$_1$, 103$_2$, 103$_3$, and 105 can be source synchronous links. FIG. 1A shows an example of connection 103 including five links 103$_0$, 103$_1$, 103$_2$, 103$_3$, and 105 for simplicity. The number of links can vary.

Each of links 103$_0$, 103$_1$, 103$_2$, 103$_3$, and 105 can be used carry a single-ended signal or, alternatively, a differential pair signal. Each of links 103$_0$, 103$_1$, 103$_2$, 103$_3$, and 105 can include a single conductive trace (e.g., to carry a single-ended signal) or, alternatively, multiple conductive traces (e.g., to carry a differential signal pair). The conductive traces of connection 103 can include metal-based traces of a bus on a circuit board (e.g., printed circuit board of an electronic package or system) where devices 101 and 102 are located. In an alternative arrangement, connection 103 does not have to include conductive lines on a circuit board. For example, connection 103 can include a medium (e.g., air) for wireless communication between devices 101 and 102. In another example, connection 103 can include a medium that can be package traces between devices 101 and 102 where devices 101 and 102 can be connected through package layer.

Devices 101 and 102 can communicate with each other by providing signals on connection 103. For example, as shown in FIG. 1A, device 101 can include a transceiver 104 including data transmitters (DATA TXs) 104$_0$, 104$_1$, 104$_2$, and 104$_3$ to transmit respective data information (e.g., data signals) DATA$_0$, DATA$_1$, DATA$_2$, and DATA$_3$ on links 103$_0$, 103$_1$, 103$_2$, and 103$_4$, respectively, and a clock transmitter (CLK TX) 105*a* to transmit a signal (e.g., a clock or strobe signal) CLK on link 105. Signal CLK can include timing information (e.g., strobe timing) associated with transmission of data information DATA$_0$, DATA$_1$, DATA$_2$, and DATA$_3$. Data information DATA$_0$, DATA$_1$, DATA$_2$, and DATA$_3$ are aligned (e.g., edge-aligned) with the edges of signal CLK.

Device 102 can include data paths 110$_1$, 110$_1$, 110$_2$, and 110$_3$ to receive data information DATA$_0$, DATA$_1$, DATA$_2$, and DATA$_3$, respectively. Each of data information DATA$_0$, DATA$_1$, DATA$_2$, and DATA$_3$ can include a number of bits (bits of information). The bits can have binary values (binary 0 and binary 1) or ternary encoding or other encoding bits. Device 102 can include a DLL 120, a clock tree circuit 130, and a functional unit 140. DLL 120 can operate to receive signal (e.g., input clock signal) CLK from link 105 and generate signal (e.g., delayed clock signal) CLK$_{DLL}$ based on signal CLK. Clock tree circuit 130 can operate to receive signal CLK$_{DLL}$ and provide signals (e.g., data capture clock signals) CLK$_{DATA0}$, CLK$_{DATA1}$, CLK$_{DATA2}$, and CLK$_{DATA3}$.

Data paths 110$_0$, 110$_1$, 110$_2$, and 110$_3$ can use timing of signals CLK$_{DATA0}$, CLK$_{DATA1}$, CLK$_{DATA2}$, and CLK$_{DATA3}$, respectively, to capture the bits of data information DATA$_0$, DATA$_1$, DATA$_2$, and DATA$_3$, respectively. Data paths 110$_0$, 110$_1$, 110$_2$, and 110$_3$ can provide the captured bits in the form of information (data information) D$_0$, D$_1$, D$_2$, and D$_3$ to functional unit 140. Functional unit 140 can include functions to further process formation D$_0$, D$_1$, D$_2$, and D$_3$.

As shown in FIG. 1A, DLL 120 can receive signal (feedback clock signal) CLK_FB$_A$ from clock tree circuit 130. DLL 120 can use signal CLK_FB$_A$ to control the timing of signals CLK$_{DATA0}$, CLK$_{DATA1}$, CLK$_{DATA2}$, and CLK$_{DATA3}$ to allow data paths 110$_0$, 110$_1$, 110$_2$, and 110$_3$ to properly capture the bits of data information DATA$_0$, DATA$_1$, DATA$_2$, and DATA$_3$, respectively.

Figure 1B:
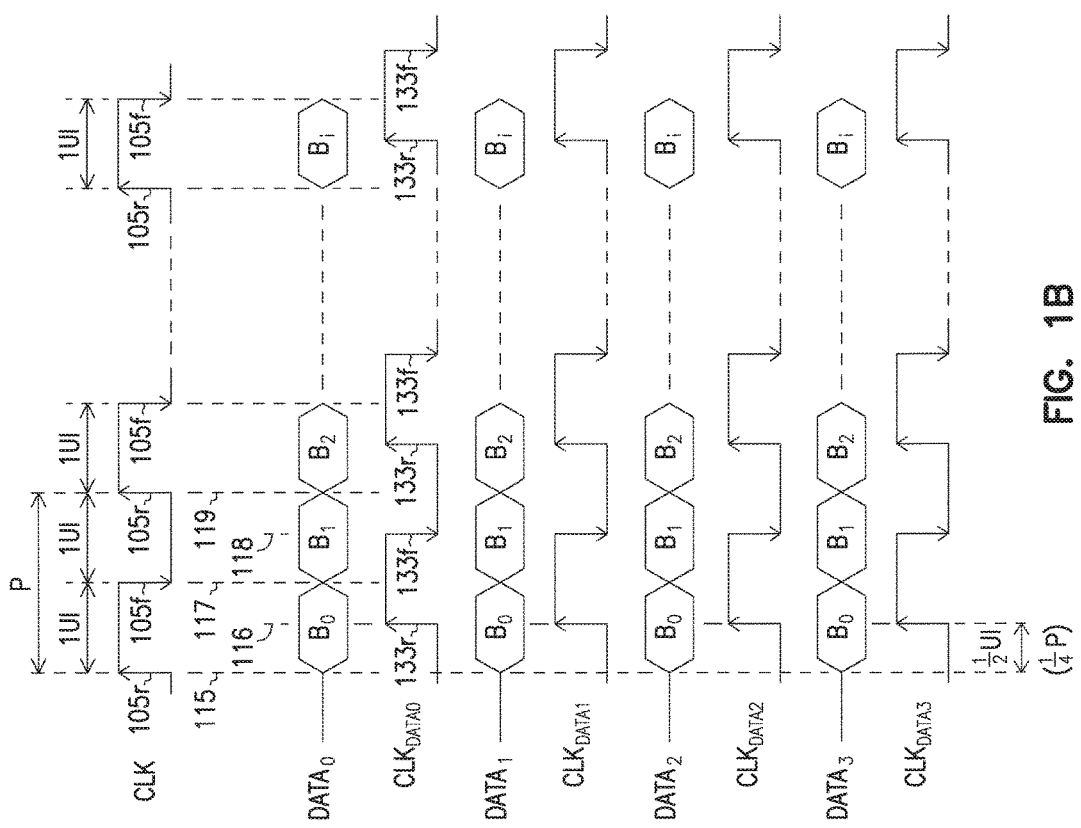
FIG. 1B is a timing diagram showing timing relationships among clock signals and data information of FIG. 1A, according to some embodiments described herein.

FIG. 1B is a timing diagram showing timing relationships among clock signals and data information of FIG. 1A, according to some embodiments described herein. As shown in FIG. 1B, signal CLK has a period P that can be divided into unit intervals (UIs). In the example of FIG. 1B, one UI (1 UI) is equal to one half of period P of signal CLK. Each of data information DATA$_0$, DATA$_1$, DATA$_2$, and DATA$_3$ can include a number of bits B$_0$, B$_1$, and B$_2$ through B$_i$. FIG. 1B shows an example where each bit of each of data information DATA$_0$, DATA$_1$, DATA$_2$, and DATA$_3$ can be transmitted within one UI. The example of FIG. 1B shows a double data rate (DDR) transfer where two bits (e.g., B$_0$ and B$_1$) of each of data information DATA$_0$, DATA$_1$, DATA$_2$, and DATA$_3$ can be transmitted within one period P of signal CLK. Thus, in the example of FIG. 1B, a UI is a time interval (e.g., ½ of period P) of signal CLK at which one bit (e.g., bit B$_0$) of each of data information DATA$_0$, DATA$_1$, DATA$_2$, and DATA$_3$ can be transmitted.

As shown in FIG. 1B, signal CLK has an edge 105*r* (rising edge) and an edge 105*f* (falling edge). Each of signals CLK$_{DATA0}$, CLK$_{DATA1}$, CLK$_{DATA2}$, and CLK$_{DATA3}$ has rising and falling edges. For example, signal CLK$_{DATA0}$ has an edge 133*r* (rising edge) and an edge 133*f* (falling edge). Each bit of data information DATA$_0$ can have boundaries (e.g., left and right boundaries) within one unit interval (1 UI). For example, bit B$_0$ of data information DATA$_0$ has boundaries 115 and 117, and bit B$_1$ of data information DATA$_0$ has boundaries 117 and 119.

As shown in FIG. 1B, data information DATA$_0$, DATA$_1$, DATA$_2$, and DATA$_3$ are edge-aligned with signal CLK, such that the rising and falling edges of signal CLK are aligned with the boundaries of bits B$_0$, B$_1$, B$_2$, and B$_3$ of each of data information DATA$_0$, DATA$_1$, DATA$_2$, and DATA$_3$. For example, edge 105*r* (rising edge) of signal CLK can be aligned with boundary (e.g., left boundary) 115 of bit B$_0$ of data information DATA$_0$, and edge 105*f* (falling edge) of signal CLK can be aligned with boundary (e.g., right boundary) 117 of bit B$_0$ of data information DATA$_0$.

Each of signals CLK$_{DATA0}$, CLK$_{DATA1}$, CLK$_{DATA2}$, and CLK$_{DATA3}$ can be ½ UI (which is one-fourth of period P (¼P) or 90 degrees) out of phase with signal CLK. This means that each of signals CLK$_{DATA0}$, CLK$_{DATA1}$, CLK$_{DATA2}$, and CLK$_{DATA3}$ can be center-aligned with the center of the boundaries (e.g., the center of the data eye) of bits B$_0$, B$_1$, B$_2$, and B$_3$ of respective data information DATA$_0$, DATA$_1$, DATA$_2$, and DATA$_3$. For example, as shown in FIG. 1B, signal CLK$_{DATA0}$ is center-aligned with data information DATA$_0$, such that edge 105*r* (rising edge) of signal CLK$_{DATA0}$ can be aligned with a center 116 of boundaries 115 and 117 of bit B$_0$ of data information DATA$_0$, and edge 105*f* (falling edge) of signal CLK$_{DATA0}$ can be aligned with center 118 of boundaries 117 and 119 of bit B$_1$ of data information DATA$_0$.

DLL 120 of device 120 (FIG. 1A) can operate to generate signals CLK$_{DATA0}$, CLK$_{DATA1}$, CLK$_{DATA2}$, and CLK$_{DATA3}$ based on signal CLK, such that signals CLK$_{DATA0}$, CLK$_{DATA1}$, CLK$_{DATA2}$, and CLK$_{DATA3}$ and signal CLK can have timing relationships as shown in FIG. 1B. DLL 120 can also operate to maintain such timing relationships (shown in FIG. 1B) during operations of device 102. Device 102 can include components (e.g., DLL 120) and operations of the devices described below with reference to FIG. 2 through FIG. 7.

Figure 2A:
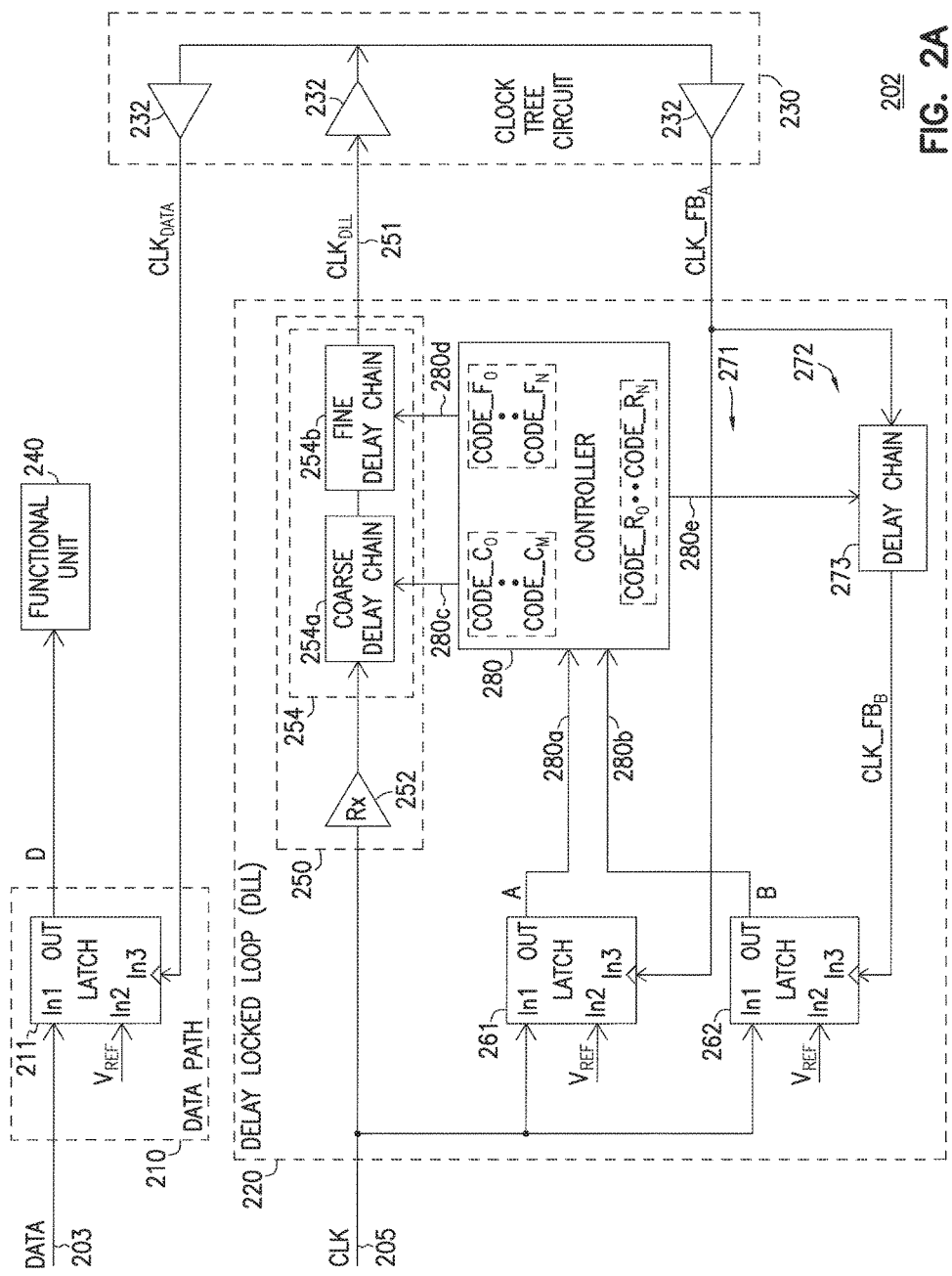
FIG. 2A shows a device including a data path, a delay locked loop (DLL), a clock tree circuit, and a functional unit, according to some embodiments described herein.

FIG. 2A shows a device 202 including a data path 210, a DLL 220, a clock tree circuit 230, and a functional unit 240, according to some embodiments described herein. Device 202 can include a node 203 to receive data information DATA, and a node 205 to receive a signal CLK. Node 203 can be coupled to a link of a connection (e.g., one of links $103_0$, $103_1$, $103_2$, and $103_3$ of FIG. 1A) and node 205 can be coupled to another the link of the connection. Data path 210 can correspond to one of data paths $110_0$, $110_1$, $110_2$, and $110_3$ of FIG. 1. Information DATA can correspond to one of data information $DATA_0$, $DATA_1$, $DATA_2$, and $DATA_3$ of FIG. 1. DLL 220 and clock tree circuit 230 of FIG. 2A can correspond to DLL 120 and clock tree circuit 130, respectively, of FIG. 1.

DLL 220 can operate to receive signal CLK and provide signal $CLK_{DLL}$ at a node 251 based on signal CLK. Clock tree circuit 230 can operate to provide signal (e.g., data capture clock signal) $CLK_{DATA}$ and signal (e.g., feedback clock signal) $CLK\_FB_A$. Signal $CLK_{DATA}$ can correspond to one of signals $CLK_{DATA0}$, $CLK_{DATA1}$, $CLK_{DATA2}$, and $CLK_{DATA3}$. Data path 210 can receive signal $CLK_{DATA}$ to capture data information DATA based on timing of signal $CLK_{DATA}$. DLL 220 can use signal $CLK\_FB_A$ to control (e.g., adjust) the timing of signal $CLK_{DATA}$. As described in more detail below, DLL 220 can operate to align the edges (rising and falling edges) of signal $CLK_{DATA}$ with the centers of respective data eyes of bits of data information DATA. As described above with reference to FIG. 1B, a center of the data eye of a bit of information can be a center of the boundaries (e.g., left and right boundaries) within a UI that separates one bit from another bit of the data information.

As shown in FIG. 2A, data path 210 can include a latch (e.g., data latch) 211, which can include an input node In1 to receive data information DATA, an input node In2 to receive a signal (e.g., a reference voltage signal) $V_{REF}$, a node In3 to receive signal $CLK_{DATA}$, and an output node OUT to provide data information DATA to functional unit 240 as data information D. Data information D has the same value as data information DATA. Functional unit 240 can perform operations to further process data information D provided by data path 210.

Data information DATA can include a number of bits. Each bit among the bits of data information DATA can be presented by a portion (e.g., portion within one UI) of the signal (received at node 203) that carries data information DATA. The value of a particular bit of data information DATA can be based on the level (e.g., voltage level) of the portion of the signal representing that particular bit. Latch 211 can operate to compare the level (e.g., voltage level) of signal $V_{REF}$ with the level (e.g., voltage level) of the signal that represents the bits of data information DATA in order to determine the values of the bits of data information DATA. Signal $V_{REF}$ can be provided with a voltage that can remain relatively unchanged (e.g., constant), such that the level of signal $V_{REF}$ can remain relatively unchanged (e.g., constant). The level of signal $V_{REF}$ can be approximately a middle point between the levels of the signal that represent binary 0 and binary 1 of the bits of data information DATA. In operation, latch 211 can determine that a particular bit of data information DATA has one value (e.g., binary 0) if a portion of the signal representing that particular bit has a level (e.g., a voltage level) lower than the level (e.g., voltage level) of signal $V_{REF}$, and another value (e.g., binary 1) if that portion of the signal has a level higher than the level of signal $V_{REF}$.

As shown in FIG. 2A, DLL 210 can include a clock path 250, a controller 280, and circuitry including latches (e.g., clock sampling latches such as like strong arm latches) 261 and 262, a feedback path 271, and a feedback path 272. Clock path input clock signal can include a receiver (Rx) 252, a delay circuit 254 including a delay chain (e.g., coarse delay chain) 254a and a delay chain (e.g., fine delay chain) 254b. Receiver 252 can operate to receive signal CLK and pass it to delay circuit 254. Delay circuit 254 can apply a time delay (e.g., an amount of time measured in time units) to signal CLK on clock path 250 and generate signal $CLK_{DLL}$. Thus, signal $CLK_{DLL}$ is a delayed version of signal CLK.

Clock tree circuit 230 can include buffers (e.g., drivers) 232 that can operate to provide signal $CLK_{DATA}$ and signal $CLK\_FB_A$ based on signal $CLK_{DLL}$. Buffers 232 can be arranged and structured, such that clock tree circuit 230 is a balanced clock tree circuit to provide signal $CLK_{DATA}$ and signal $CLK\_FB_A$ having the same phase and propagation delay. For example, buffers 232 of clock tree circuit 230 can be coupled to each other such that the rising and falling edges of signal $CLK_{DATA}$ can align with the rising and falling edges, respectively, of signal $CLK\_FB_A$. Data path 210 can use signal $CLK_{DATA}$ to capture data information DATA. DLL 220 can use signal $CLK\_FB_A$ to control the timing of signal $CLK_{DATA}$, so that the timing relationship between signal $CLK_{DATA}$ and data information DATA can remain relatively unchanged.

Each of delay chains 254a and 254b can include a number of delay elements (not shown) coupled in a chain (e.g., in series). Such delay elements can include inverters or buffers (e.g., complementary metal-oxide-semiconductor (CMOS) inverters or CMOS buffers). Each of the delay elements of delay chains 254a and 254b can provide (e.g., apply) a unit delay (e.g., a minimum amount time) to delay signal CLK on clock path 250. The unit delay provided by delay chain 254b can be less than the unit delay provided by delay chain 254b. For example, a unit delay provided by delay chain 254b can be one picosecond (1 ps) and a unit delay provided by delay chain 254a can be greater than 10 ps (e.g., a multiple of 10 ps).

Controller 280 can include a finite state machine that can control delay circuit 254 based on codes (digital codes). For example, controller 280 can use codes (e.g., coarse control codes) $CODE\_C_0$ through $CODE\_C_M$ to control (e.g., increase or decrease) the amount of time delay (e.g., the number of unit delays) applied to signal CLK on clock path 250 by delay chain 254a. Controller 280 can use codes (e.g., fine control codes) $CODE\_F_0$ through $CODE\_F_N$ to control (e.g., increase or decrease) the amount of time delay (e.g., the number of unit delays) applied to signal CLK on clock path 250 by delay chain 254b. Codes $CODE\_C_0$ through $CODE\_C_M$, $CODE\_F_0$ through $CODE\_F_M$, and $CODE\_R_0$ through $CODE\_R_N$ have known values and can be programmable in controller 280.

In operation, each of codes $CODE\_C_0$ through $CODE\_C_M$ can be selectively provided at an output (e.g., output node or output nodes) 280c of controller 280 and can cause delay chain 254a to provide a different amount of time delay to delay signal CLK on clock path 250. The amount of time delay applied by delay chain 254a can be proportional to the number of unit delays (e.g., number of delay elements of delay chain 254a) selected by codes $CODE\_C_0$ through $CODE\_C_M$.

In operation, each of codes $CODE\_F_0$ through $CODE\_F_N$ can be selectively provided at an output (e.g., output node or output nodes) 280d of controller 280 and can cause delay chain 254b to provide a different amount of time delay to delay signal CLK on clock path 250 (in addition to the amount of time delay provided by delay chain 254a). The amount of time delay applied by delay chain 254b can be proportional to the number of unit delays (e.g., number of delay elements of delay chain 254b) selected by codes CODE_$F_0$ through CODE_$F_N$. By controlling the time delay applied to signal CLK on clock path 250, DLL 220 can control the timing of signal CLK$_{DATA}$ in order to maintain the timing relationship between signal CLK$_{DATA}$ and the bits data information DATA.

FIG. 2A shows delay circuit 254 including separate delay chains 254a and 254b with different unit delays as an example. This may allow DLL 220 to provide a relatively wider range of time delay and allow DLL 220 to achieve a shorter time to adjust the timing of signal CLK$_{DATA}$ relative to the timing of signal CLK (e.g., a shorter time to lock DLL 220). Alternatively, delay chain 254a can be omitted from 254a as long as delay chain 254b can provide a range of time delay enough to delay signal CLK in order to generate signal CLK$_{DATA}$ with appropriate timing to capture the bits of data information DATA.

As shown in FIG. 2A, latch (e.g., clock sampling latch) 261 can include an input node In1 to receive signal CLK, an input node In2 to receive a signal V$_{REF}$ (which can be the same as signal V$_{REF}$ provided to latch 211), a node In3 to receive signal CLK_FB$_A$, and an output node OUT to provide information (e.g., sampled information) A. As described above, clock tree circuit 230 can be a balanced clock tree circuit in that buffers 232 of clock tree circuit 230 can be coupled to each other, such that a path from node 251 to input node In3 of latch 211 and a path from node 251 to input node In3 of latch 261 can have the same number of buffers (two of buffers 232 for example) to provide the same propagation delay. This allows signals CLK$_{DATA}$ and CLK_FB$_A$ to have the same phase.

Latch 262 (e.g., clock sampling latch) can include an input node In1 to receive signal CLK, an input node In2 to receive a signal V$_{REF}$ (which can be the same as signal V$_{REF}$ provided to latch d), node In3 to receive signal CLK_FB$_B$ (feedback clock signal), and an output node OUT to provide information (e.g., sampled information) B. Latches 211, 261, and 262 can have the same structure. For example, each of latches 211, 261, and 262 can include a strong arm latch. The same structure of latches 211, 261, and 262 allows DLL 220 to reduce or suppress mismatches (e.g., structural mismatches and setup and hold time mismatches) between components of DLL 220. This allows DLL 220 to provide a more accurate timing relationship between clock signals (e.g., signal CLK$_{DATA}$) and data information DATA.

Feedback path 271 can provide signal CLK_FB$_A$ to latch 261. Feedback path 271 can include a delay chain delay chain 273. Delay chain 273 can operate to apply a time delay (e.g., an amount of time delay) to delay signal CLK_FB$_A$ to generate signal CLK_FB$_B$. Thus, signal CLK_FB$_B$ is a delayed version (delayed feedback clock signal) of signal CLK_FB$_A$.

Delay chain 273 can include a number of delay elements (not shown) coupled in a chain (e.g., in series). Such delay elements can include inverters or buffers (e.g., CMOS inverters or CMOS buffers). Each of the delay elements of delay chain 273 can provide (e.g., apply) a unit delay (e.g., a minimum amount time) to delay signal CLK_FB$_A$. Delay chain 273 can be a replica of delay chain 254b. For example, delay chain 273 and delay chain 254b can have the same number of delay elements, and the elements of delay chain 273 can have the same structure as the delay elements of delay chain 254b. Thus, the unit delay (e.g., 1 ps) provided by delay chain 273 can be equal to the unit delay (e.g., 1 ps) provided by delay chain 254b.

Controller 280 (e.g., a finite state machine of controller 280) can control delay chain 273 based on codes (digital codes). For example, controller 280 can use codes (e.g., replica control codes) CODE_$R_0$ through CODE_$R_N$ to control (e.g., increase or decrease) the amount of time delay (e.g., the number of unit delays) applied to signal CLK_FB$_A$ by delay chain 273. In operation, each of codes CODE_$R_0$ through CODE_$R_N$ can be selectively provided at an output (e.g., output node or output nodes) 280e of controller 280 and cause delay chain 273 to provide a different amount of time delay to delay signal CLK_FB$_A$. The amount of time delay applied by delay chain 273 can be proportional to the number of unit delays (e.g., number of delay elements of delay chain 254b) selected by codes CODE_$R_0$ through CODE_$R_N$.

FIG. 2B is a timing diagram showing timing relationships among clock signals and data information DATA of FIG. 2A, according to some embodiments described herein. As shown in FIG. 2B, signal CLK has a period P, and each UI is one-half of period P. Information DATA includes a number of bits $B_0$, $B_1$, $B_2$, and $B_3$. Only four bits $B_0$, $B_1$, $B_2$, and $B_3$ of data information DATA are shown for simplicity.

As shown in FIG. 2B, data information DATA is edge-aligned with signal CLK, such that the rising and falling edges of signal CLK are aligned with the boundaries (e.g., left and right boundaries) of bits $B_0$, $B_1$, $B_2$, and $B_3$ of data information DATA. Signal CLK$_{DATA}$ can be ½ UI (one-fourth of period P or 90 degrees) out of phase with signal CLK, such that signals CLK$_{DATA}$ can be aligned with the center of the boundaries (e.g., data eye) bits $B_0$, $B_1$, $B_2$, and $B_3$ of data information DATA. Signal CLK_FB$_A$ can also be ½ UI out of phase with signal CLK.

The relationship between signal CLK and signal CLK$_{DATA}$ Can occur after DLL 220 of device 202 performs a calibration, as described in more detail below. The operations of device 202 may include a boot stage (e.g., power-on stage) where device 202 (or the system (e.g., apparatus 100) that includes device 202) can perform some initialization operations (e.g., calibration of DLL 220). Before the calibration (e.g., before completion of a boot stage of device 202), signal CLK$_{DATA}$ (FIG. 2B) may not be ½ UI out of phase with signal CLK. In the calibration (e.g., during a boot stage of device 202), device 202 can perform an initial clock-centering operation (e.g., initial clock-centering mode) to cause signal CLK$_{DATA}$ to be ½ UI out of phase with signal CLK, such that signal CLK$_{DATA}$ can be center-aligned with data information DATA (as shown in FIG. 2B). After signal CLK$_{DATA}$ is ½ UI out of phase with signal CLK (e.g., after the boot stage) as a result of the initial clock-centering operation, device 202 can perform a clock re-centering operation (e.g., clock re-centering mode) of the calibration. In the clock re-centering operation, device 202 can adjust the amount of time delay applied by delay circuit 254 (e.g., by delay chain delay chain 254b) in order to maintain the timing maintain the timing relationships between signal CLK$_{DATA}$ and data information DATA (FIG. 2B). Controller 280 DLL 220 can perform the calibration (e.g., initial clock-centering operation and clock re-centering operation) based on the values of information A and B provided to respective input nodes 280a and 280b of controller 280.

As shown in FIG. 2A, information (e.g., sampled information) A and B are provided at the output nodes of latches 261 and 262, respectively. The value of information (e.g., sampled information) A can be based on the level (e.g., voltage value) of signal CLK relative to the level (e.g., voltage value) of signal $V_{REF}$ at the time signal CLK is sampled using signal CLK_FB$_A$ (e.g., using the rising edge of signal CLK_FB$_A$). For example, the value of information A is binary 1 (A=1) if the level (e.g., a voltage level) of signal CLK is higher than the level (e.g., a voltage level) of signal $V_{REF}$ at the time signal CLK is sampled using signal CLK_FB$_A$. In another example, the value of information A is binary 0 (A=0) if the level of signal CLK is lower than the level of signal $V_{RE}$F at the time signal CLK is sampled using signal CLK_FB$_A$.

Similarly, the value of information (e.g., sampled information) B can be based on the level (e.g., a voltage level) of signal CLK relative to the level (e.g., a voltage level) of signal $V_{REF}$ at the time signal CLK is sampled (e.g., clocked) using signal CLK_FB$_B$(e.g., using the rising edge of signal CLK_FB$_B$). For example, the value of information B is binary 1 (B=1) if the level of signal CLK is higher than the level of signal $V_{REF}$ at the time signal CLK is sampled using signal CLK_FB$_B$. In another example, the value of information B is binary 0 (B=0) if the level of signal CLK is lower than the level of signal $V_{REF}$ at the time signal CLK is sampled (e.g., clocked) using signal CLK_FB$_B$.

FIG. 3A through FIG. 3D show four different possible combinations (e.g., outcomes) of the values of information A and B of FIG. 2A during a calibration (e.g., during an initial clock-centering operation) of device 202, according to some embodiments described herein. As shown in FIG. 3A through FIG. 3D, the combinations of the values of information A and B during the initial clock centering operation include A=1 and B=–0 (FIG. 3A), A=0 and B=0 (FIG. 3B), A=0 and B=1 (FIG. 3C), and A=1 and B=1 (FIG. 3D). The combinations of the values of information A and B shown FIG. 3A through FIG. 3D can be the values before signal CLK$_{DATA}$ is adjusted to be ½ UI out of phase with signal CLK.

The initial clock-centering operation of device 202 can include searching for an initial (e.g., a first) rising edge of signal CLK and an initial (e.g., a first) falling edge of signal CLK. Searching for the initial rising edge of signal CLK can include applying an amount of time delay (e.g., to a minimum delay time) provided by delay circuit 254 and amount of time delay (e.g., to a minimum delay time) provided by delay chain 273 that provides a value of "1" (binary 1) for information A. Searching for the initial falling edge of signal CLK can include applying an amount of time delay (e.g., to a minimum delay time) provided by delay circuit 254 and amount of time delay (e.g., to a minimum delay time) provided by delay chain 273 that provides a value of "0" (binary 0) for information B.

During the initial clock-centering operation of device 202, controller 280 can adjust the amount of time delay applied using delay circuit 254 and delay chain 273 depending on the values of information A and B shown in FIG. 3A through FIG. 3D. For example, controller 280 can decrease the amount of delay applied by delay chain 254b if A=1 and B=0 (FIG. 3A), decrease the amount of delay applied by delay chain 273 if A=0 and B=0 (FIG. 3B), increase the amount of delay applied by delay chain 254b if A=0 and B=1 (FIG. 3C), and increase the amount of delay applied by delay chain 273 if A=1 and B=1 (FIG. 3D).

Controller 280 can adjust the amount of time delay applied to signal CLK on clock path 250 and the amount of time delay applied to signal CLK_FB$_A$ on feedback path 272 until the values of information A and B are converged (described below with reference to FIG. 4A). As described below with reference to FIG. 4A and FIG. 4B, after values of information A and B are converged, controller 280 can use the value of codes CODE_R$_0$ through CODE_R$_N$ to change the value of CODE_F$_0$ through CODE_F$_N$, so that signal CLK$_{DATA}$ can be aligned with the center of the data eyes of each bit of data information DATA.

FIG. 4A shows timing relationships among signals CLK, CLK_FB$_A$, CLK_FB$_B$, and CLK$_{DATA}$ when information A and B of FIG. 2A are converged during an initial clock centering operation, according to some embodiments described herein. As shown in FIG. 4, when information A and B are converged, the rising edge of signal CLK_FB$_A$ can align with the rising edge of signal CLK, and the rising edge of signal CLK_FB$_B$ can align with the falling edge of signal CLK. Since signal CLK$_{DATA}$ and signal CLK_FB$_A$ have the same phase, the rising edge of signal CLK$_{DATA}$ Can also align with the rising edge of signal CLK.

Controller 280 can determine that the values of information A and B are deemed to be converged (as shown in FIG. 4A) based on a dithering scheme or, alternatively, a timer scheme. In the dithering scheme, controller 280 detects (during the initial clock-centering operation) whether the value of information A has a repeated pattern (e.g., binary pattern 010101 or 101010) and whether the value of information B has a repeated pattern (e.g., binary pattern 010101 or 101010). In the timer scheme, controller 280 can start the initial clock-centering operation and adjust the amount of time delay applied to signal CLK on clock path 250 and the amount of time delay applied to signal CLK_FB$_A$ on feedback path 272 based on the values of information A and B (FIG. 3A through FIG. 3B). Then, controller 280 can stop (e.g., automatically stop) adjusting the amount of time delay applied to signal CLK on clock path 250 and the amount of time delay applied to signal CLK_FB$_A$ on feedback path 272 after a time interval (in time units) has lapsed from the start of initial clock-centering operation. Such a time interval can be determined based on a predetermined time interval (e.g., based on design simulation) at which the values of information A and B are deemed to be converged.

As shown in FIG. 4A, after the values of information A and B are converged, and each of signals CLK_FB$_A$ and CLK$_{DATA}$ are one UI out of phase with signal CLK. This means that the amount of time delay provided by delay chain 273 can be equivalent to one UI. In order to cause signal CLK$_{DATA}$ to be ½ UI out of phase with signal CLK (so that signal CLK$_{DATA}$ can be center-aligned with data information DATA, as shown in FIG. 2B), controller 280 can change the value of CODE_F$_0$ through CODE_F$_N$ in order to adjust the amount of time delay applied to signal CLK on clock path 250. In this adjustment, controller 280 can increase the amount of time delay applied to signal CLK on clock path 250 by an additional amount of time delay equivalent to an additional ½ UI. For example, if controller 280 uses CODE_R$_i$ (one of codes CODE_R$_0$ through CODE_R$_N$) in delay chain 273 and CODE_F$_j$ (one of codes CODE_F$_0$ through CODE_F$_N$) in delay chain 254b at the time the values of information A and B are converged (FIG. 4A), then controller 280 can add one-half of the value of a CODE_R$_i$ to the value of the CODE_F$_j$ and use the resulting (new) code (e.g., CODE_F$_k$) in delay chain 254b. This means that after the values of information A and B are converged, controller 280 can use code (a new code) CODE_F$_k$=CODE_F$_j$+½ CODE_R$_i$ in delay chain 254b in order to cause signal CLK$_{DATA}$ to be ½ UI out of phase with signal CLK. Controller 280 can keep unchanged the code (e.g., CODE_R$_i$) in delay chain 273 used in delay chain 273.

FIG. 4B shows timing relationships among signals CLK, CLK_FB$_A$, CLK_FB$_B$, and CLK$_{DATA}$ after controller 280 causes signal CLK$_{DATA}$ to be ½ UI out of phase with signal CLK, according to some embodiments described herein. As shown in FIG. 4B, each of signals $CLK\_FB_A$, $CLK\_FB_B$, and $CLK_{DATA}$ is shifted by ½ UI in comparison with the same signals in FIG. 4A. This is the result of controller 280 adjusting the amount of time delay applied to signal CLK on clock path 250 by using $CODE\_F_k = CODE\_F + ½ CODE\_R_i$ for delay chain 254b. After the timing relationships among signals CLK, $CLK\_FB_A$, $CLK\_FB_B$, and signal $CLK_{DATA}$ (shown in FIG. 4B) are achieved, the initial clock centering operation is completed and controller 280 can place DLL 220 in a specific mode (e.g., a lock mode). In such a mode, controller 280 may stop adjusting the time delay applied to signal CLK on clock path 250 and the time delay applied to signal $CLK\_FB_A$ on feedback path 272. Controller 280 may continue to adjust the time delay applied to signal CLK on clock path 250 in a clock re-centering operation.

Device 202 can perform a clock re-centering operation after the initial clock centering operation is completed. In the re-centering operation, device 202 can adjust the amount of time delay applied by delay circuit 254 (e.g., by delay chain delay chain 254b) based on the value of information B. This allows device 102 to compensate for variations in operating voltage and temperature of device 202 in order to maintain the timing relationships between signal $CLK_{DATA}$ and data information DATA (FIG. 2B).

Figure 5:
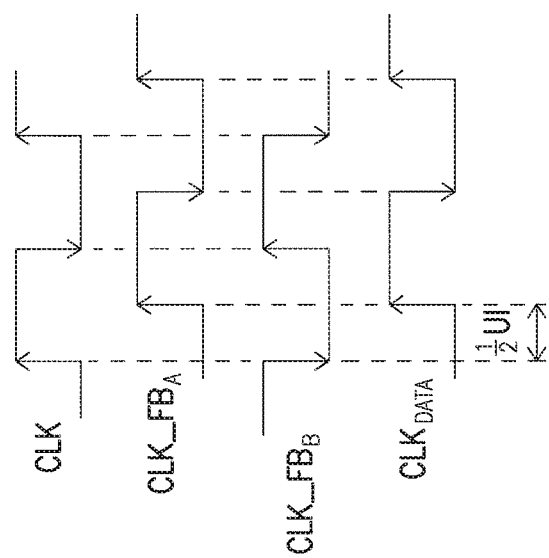
FIG. 5 shows timing relationships clock signals of the device of FIG. 2A during a clock re-centering operation of the device, according to some embodiments described herein.

FIG. 5 shows timing relationships among signals CLK, $CLK\_FB_A$, $CLK\_FB_B$, and $CLK_{DATA}$ during a clock re-centering operation, according to some embodiments described herein. The timing relationships among signals CLK, $CLK\_FB_A$, $CLK\_FB_B$, and $CLK_{DATA}$ in FIG. 5 are the same as those shown in FIG. 4B, except for the timing relationship between signals signal CLK and signal $CLK\_FB_B$. In the re-centering operation, controller 280 can decrease the amount of time delay applied to signal $CLK\_FB_B$ on feedback path 272 by an amount of time delay equivalent to UI in order to cause the rising edge of signal $CLK\_FB_B$ to be aligned with the falling edge of signal CLK. For example, as described above with reference to FIG. 4A and FIG. 4B, controller 280 may use $CODE\_R_i$ in delay chain 273 to achieve the timing relationships among signals CLK, $CLK\_FB_A$, $CLK\_FB_B$, and $CLK_{DATA}$ during the initial clock centering operation. In the clock re-centering operation (FIG. 5), controller 280 may use a $CODE\_R_h$ equal to one-half of the value of $CODE\_R_i$ (e.g., $CODE\_R_h = ½ CODE\_R_i$) in delay chain 273. After code $CODE\_R_h$ is used in delay chain 273 to achieve the timing relationships between signal CLK and signal $CLK\_FB_B$ in FIG. 5, controller 280 can monitor the relationship between signal CLK and signal $CLK\_FB_B$ based on the values of information A and B in order to compensate for variations in operating voltage and temperature of device 202 in order to maintain the timing relationships between signal $CLK_{DATA}$ and data information DATA (FIG. 2B). The value of information A can remain unchanged at "1" since the rising edge of signal $CLK\_FB_A$ used to sample signal CLK at latch 261 (FIG. 2A) can occur when the level of signal CLK is higher than the level signal $V_{REF}$. Thus, controller 280 may compensate for variations in operating voltage and temperature of device 202 based on the value of information B (e.g., based on the value of only information B instead of based on the values of both information A and B). For example, if the value of B is "0," then controller 280 can increase the amount of time delay applied by delay chain 254b, whereas if the value of B is "1," then controller 280 can decrease the amount of time delay applied by delay chain 254b. During the clock re-centering operation, controller 280 can keep the amount of time delay applied to signal $CLK\_FB_A$ on feedback path 272 unchanged (e.g., can use the same code $CODE\_R_h$ for delay chain 273) when controller 280 adjusts the amount of time delay applied by delay chain 254b.

The above initial clock centering operation uses an even UI (e.g., FIG. 4A) delay as an example. However, an odd UI delay can be used for the initial clock centering operation. For example, the rising edges of signal $CLK\_FB_A$ and signal $CLK\_FB_B$, can be aligned with the falling and rising, respectively, of signal CLK. In the odd UI example, the rising edge of signal $CLK\_FB_B$ (FIG. 5) can be aligned with the rising of signal CLK during a clock re-centering operation. The operations (e.g., algorithm) described above is not limited to single ended of signal CLK, it can be extended to differential phases of signal CLK. In the case of signal CLK having differential phases, one phase of the differential signal CLK can be provided to the input of latch 261 and the other phase (e.g., complementary phase) of the differential signal CLK can be provided to the input of latch 262. During the calibration operation (e.g., initial clock-centering operation), the rising edges of signal $CLK\_FB_A$ can be aligned with the rising edge of one of the phases of the differential signal CLK and the rising edge of signal $CLK\_FB_B$ can be aligned with the rising edge of the other phase (e.g., complimentary phase) of the differential signal CLK. The clock re-centering operation can follow the above-mentioned even and odd mode of complimentary phase of signal CLK.

Figure 6:
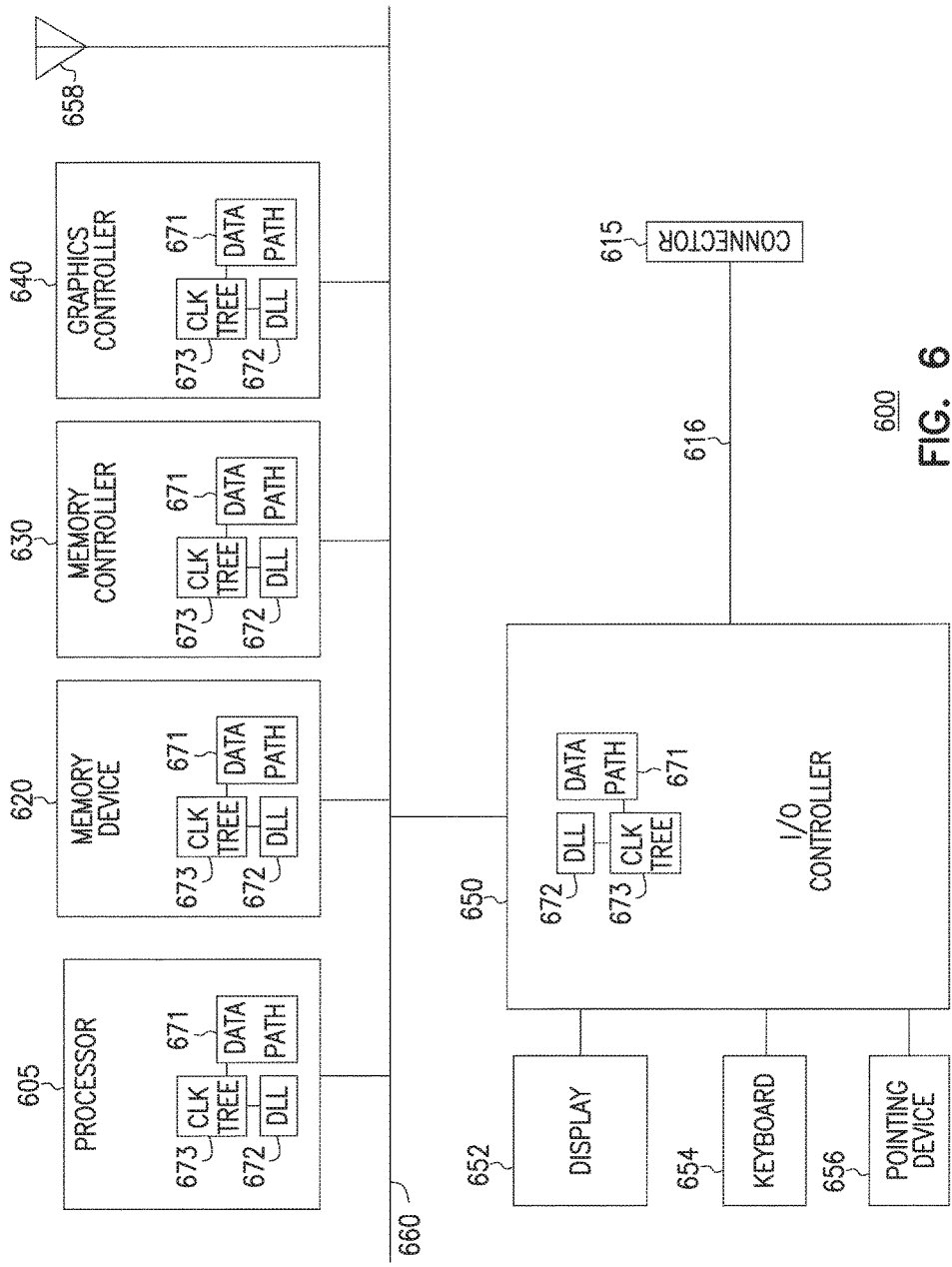
FIG. 6 shows an apparatus in the form of a system (e.g., electronic system) according to some embodiments described herein.

FIG. 6 shows an apparatus in the form of a system (e.g., electronic system) 600, according to some embodiments described herein. System 600 can include or be included in a computer, a tablet, or other electronic systems. As shown in FIG. 6, system 600 can include a processor 605, a memory device 620, a memory controller 630, a graphics controller 640, an I/O controller 650, a display 652, a keyboard 654, a pointing device 656, at least one antenna 658, a connector 615, and a bus 660.

Each of processor 605, memory device 620, memory controller 630, graphics controller 640, and I/O controller 650 can include an IC chip (e.g., device 101 or 102 of FIG. 1).

In some arrangements, system 600 does not have to include a display. Thus, display 652 can be omitted from system 600. In some arrangements, system 600 does not have to include any antenna. Thus, antenna 658 can be omitted from system 600.

Processor 605 can include a general-purpose processor or an application specific integrated circuit (ASIC). Processor 605 can include a central processing unit (CPU).

Memory device 620 can include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 605. In an alternative arrangement, memory device 620 and processor 605 can be located on the same die. In such an alternative arrangement, memory device 620 is an embedded memory in processor 605, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antennas 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615. Connector 615 may be coupled to I/O controller 650 through a connection 616 (e.g., a bus).

Connector 615, connection 616, and at least a portion of bus 660 can include conductive lines that conform with at least one of USB, DP, HDMI, Thunderbolt, PCIe, Ethernet, and other specifications.

As shown in FIG. 6, each of processor 605, memory device 620, memory controller 630, graphics controller 640, and I/O controller 650 can include data paths 671, a DLL 672, and a clock tree circuit (CLK TREE) 673. Data paths 671, DLL 672, and clock tree circuit 673 can include any of the data paths, the DLL, and the clock tree circuit, respectively, described above with reference to FIG. 1A through FIG. 5. For example, data path 671 can include data paths $110_0$, $110_1$, $110_2$, and $110_3$ of FIG. 1A and data path 210 of FIG. 2A. DLL 672 can include DLL 120 of FIG. 1A and DLL 220 of FIG. 2A. Clock tree circuit 673 can include clock tree circuit 130 of FIG. 1A and clock tree circuit 230 of FIG. 2A. FIG. 6 shows an example where each of processor 605, memory device 620, memory controller 630, graphics controller 640, and I/O controller 650 can include data paths 671, DLL 672, and a clock tree circuit 673. However, in some structures of system 600, fewer than all of processor 605, memory device 620, memory controller 630, graphics controller 640, and I/O controller 650 include data paths 671, DLL 672, and clock tree circuit 673.

FIG. 6 shows the components of system 600 arranged separately from each other as an example. For example, each of processor 605, memory device 620, memory controller 630, graphics controller 640, and I/O controller 650 can be located on a separate IC (e.g., semiconductor die or an IC chip). In some arrangements, two or more components (e.g., processor 605, memory device 620, graphics controller 640, and I/O controller 650) of system 600 can be located on the same die (e.g., same IC chip) that forms a system-on-chip (SoC).

Figure 7:
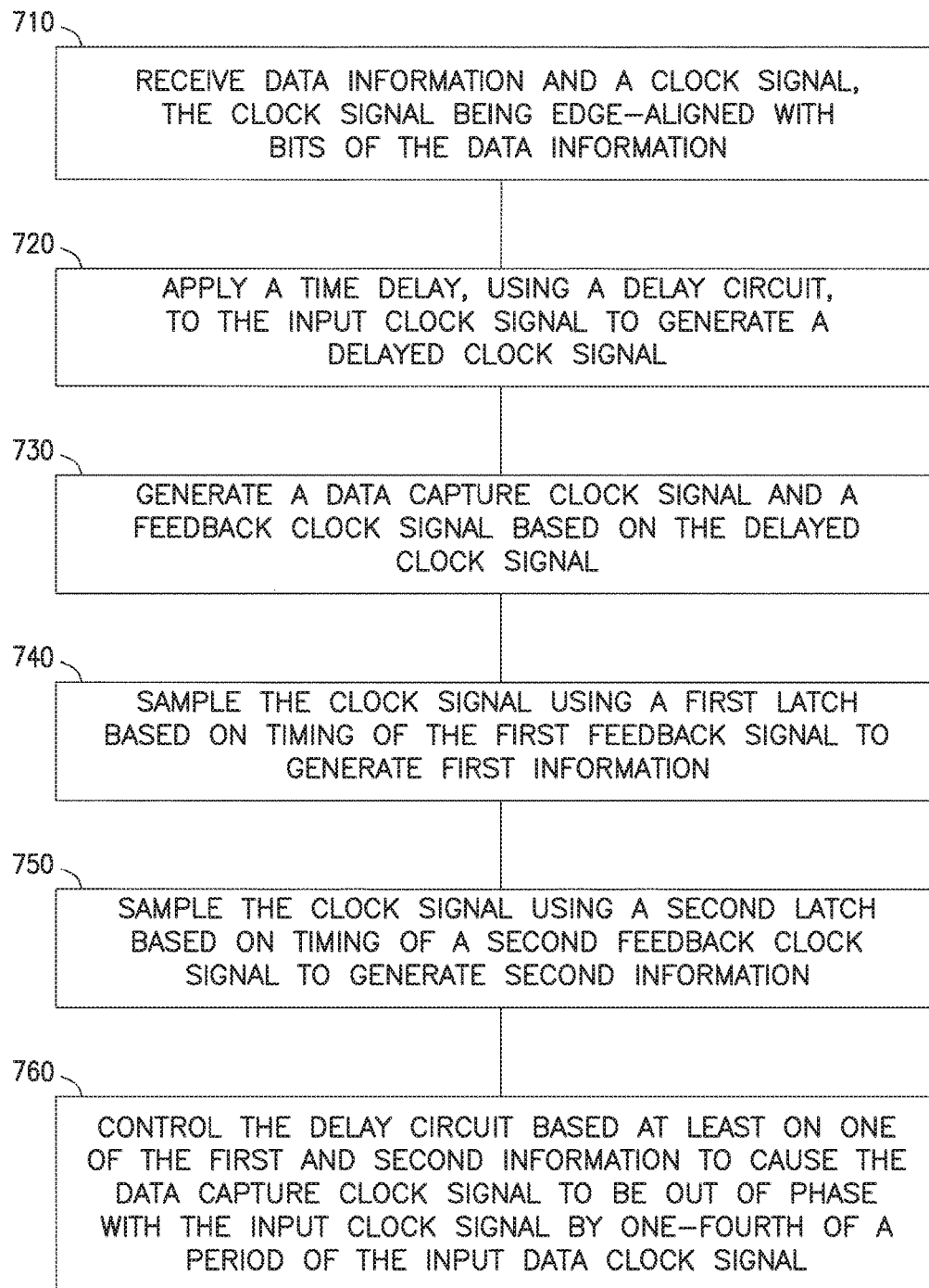
FIG. 7 is a flowchart showing a method of operating an apparatus, according to some embodiments described herein.

FIG. 7 is a flowchart showing a method 700 of operating an apparatus, according to some embodiments described herein. The apparatus used in method 700 can include any of the apparatuses (e.g., apparatus 100 and system 600 including the data paths, the DLLs, and the clock tree circuits) described above with reference to FIG. 1A through FIG. 6. Some of the activities in method 700 may be performed by hardware, software, firmware, or any combination of hardware, software, and firmware. For example, some of the activities in method 700 may be performed by hardware, software, firmware, or any combination of hardware, software, and firmware implemented a controller (e.g., in a finite state machine of controller 200 of FIG. 2A) of the apparatus (e.g., apparatus 100).

As shown in FIG. 7, activity 710 of method 700 can include receiving data information and a clock signal, with the clock signal being edge-aligned with bits of the data information. Activity 720 can include applying a time delay to the input clock signal, using a delay circuit, to generate a delayed clock signal. Activity 730 can include generating a data capture clock signal and a feedback clock signal based on the delayed clock signal. Activity 740 can include sampling the clock signal using a first latch based on timing of the first feedback clock signal to generate first information. Activity 750 can include sampling the clock signal using a second latch based on timing of a second feedback clock signal to generate second information. Activity 760 can include controlling the delay circuit based at least on one of the first and second information to cause the data capture clock signal to be out of phase with the input clock signal by one-fourth of a period of the input data clock signal.

Method 700 can include fewer or more activities relative to activities 710, 720, 730, 740, 750, and 760 shown in FIG. 7. For example, method 700 can include activities and operations of any of the apparatuses (e.g., apparatus 100 and system 600 including the data paths, the DLLs, and the clock tree circuits) described above with reference to FIG. 1A through FIG. 6.

The illustrations of the apparatuses (e.g., apparatus 100 and system 600 including the data paths, the DLLs, and the clock tree circuits) and methods (e.g., method 700 and operations of apparatus 100 and system 600 including operations of the data paths, the DLLs, and the clock tree circuits) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a data path to receive data information based on timing of a data capture clock signal, a clock path including a delay circuit to apply a time delay to an input clock signal and generate a delayed clock signal, a clock tree circuit to provide the data capture clock signal and a feedback clock signal based on the delayed clock signal, circuitry including latches to sample the input clock signal based on timing of the feedback clock signal and provide sampled information, and a controller to control the delay circuit based on the sampled information in order to cause the data capture clock signal to be out of phase with the input clock signal by one-fourth of a period of the input clock signal.

In Example 2, the subject matter of Example 1 may optionally include, wherein the feedback clock signal is a first feedback clock signal, and the latches include a first latch to sample the input clock signal based on timing of the first feedback clock signal and provide a first portion of the sampled information, and a second latch to sample the input clock signal based on timing of a second feedback clock signal and provide a second portion of the sampled information.

In Example 3, the subject matter of Example 2 may optionally include, wherein the circuitry includes a delay chain to delay the first feedback clock signal by an amount of time delay to generate the second feedback clock signal.

In Example 4, the subject matter of Example 2 may optionally include, wherein the controller is to cause each of the first and second feedback clock signals to be out of phase with the input clock signal by one-fourth of the period of the input clock signal during an operation of causing the data capture clock signal to be out of phase with the input clock signal.

In Example 5, the subject matter of Example 2 may optionally include, wherein the controller is to align an edge of the second feedback clock signal with an edge of the input clock signal after the controller causes each of the first and second feedback clock signals to be out of phase with the input clock signal.

In Example 6, the subject matter of Example 5 may optionally include, wherein the controller is to adjust an amount of time delay applied to the input clock signal on the clock path based on value of the second portion of the sampled information In Example 7, the subject matter of Example 2 may optionally include, wherein the controller is to perform an operation to align an edge of the first feedback clock signal with a first edge of the input clock signal during an operation of causing the data capture clock signal to be out of phase with the input clock signal, and to align an edge of the second feedback clock signal with a second edge of the input clock signal during the operation of causing the data capture clock signal to be out of phase with the input clock signal Example 8 includes subject matter (such as a device, an electronic apparatus (e.g., circuit, electronic system, or both), or a machine) including a first node to receive data information, a second node to receive an input clock signal, a data path including a latch, the latch including a first input node coupled to the first node, a second input node to receive a data capture clock signal, and an output node to provide bits of the data information, a clock path including a delay circuit to apply a time delay to the input clock signal to generate a delayed clock signal, a clock tree circuit to receive the delayed clock signal and provide the data capture clock signal and a first feedback clock signal, a first latch having a first input node coupled to the second node, a second input node to receive the first feedback clock signal, and an output node, a delay circuit to apply a time delay to the first feedback clock signal and generate a second feedback clock signal, a second latch having a first input node coupled to the second node, a second input node to receive the second feedback clock signal, and an output node, and a controller to receive information from the output node of each of the first and second latches, and output nodes coupled to the delay circuit of the clock path and the delay chain.

In Example 9, the subject matter of Example 8 may optionally include, wherein the delay chain is a first delay chain, and the delay circuit includes a second delay chain, and the first and second delay chains include a same number of delay elements.

In Example 10, the subject matter of Example 8 or 9 may optionally include, wherein the controller includes a finite state machine to control the delay circuit based on first codes and to control the delay chain based on second codes.

In Example 11, the subject matter of Example 8 or 9 may optionally include, wherein the first, second, and third latches have a same structure In Example 12, the subject matter of Example 8 or 9 may optionally include, wherein the clock tree circuit includes a first number of buffers coupled between the delay circuit of the clock path and the second input node of the latch of the data path, a second number of buffers coupled between the delay circuit and the second input node of the second latch, and the number of the second buffers is the same as the number of the first buffers.

Example 13 includes subject matter (such as a device, an electronic apparatus (e.g., circuit, electronic system, or both), or a machine) including conductive lines on a circuit board, a first device coupled to the conductive lines, and a second device coupled to the conductive lines to receive data information and an input clock signal from the first device, the second device including a clock path including a delay circuit to apply a time delay to the input clock signal and generate a delayed clock signal, a clock tree circuit to provide a data capture clock signal and a first feedback clock signal based on the delayed clock signal, a data path to receive bits of the data information based on timing of the data capture clock signal, and a delay locked loop coupled to the clock tree circuit, the delay locked loop including a first strong arm latch to sample the input clock signal based on timing of the feedback clock signal and provide a first sampled information, a second strong arm latch to sample the input clock signal based on timing of a second feedback clock signal and provide a second sampled information, and a controller to control the delay circuit based on at least one of the first and second sampled information in order to cause the data capture clock signal to be out of phase with the input clock signal by one-fourth of a period of the input clock signal.

In Example 14, the subject matter of Example 13 may optionally include, wherein the conductive lines are part of source synchronous links.

In Example 15, the subject matter of Example 13 may optionally include, wherein the data path includes a strong arm latch to receive the bits of the data information.

In Example 16, the subject matter of Example 13 may optionally include, wherein the controller is to perform an operation to align an edge of the first feedback clock signal with a rising edge of the input clock signal during an operation of causing the data capture clock signal to be out of phase with the input clock signal, and to align an edge of the second feedback clock signal with a falling edge of the input clock signal during an operation of causing the data capture clock signal to be out of phase with the input clock signal.

In Example 17, the subject matter of Example 16 may optionally include, wherein the edge of the first feedback clock signal includes a rising edge of the first feedback clock signal, and the edge of the second feedback clock signal includes a rising edge of the second feedback clock signal.

Example 18 includes subject matter (such as a method of operating a device, an electronic apparatus (e.g., circuit, electronic system, or both), or a machine) including receiving data information and an input clock signal, the input clock signal being edge-aligned with bits of the data information, applying a time delay to the input clock signal using a delay circuit to generate a delayed clock signal, generating a data capture clock signal and a feedback clock signal based on the delayed clock signal, sampling the input clock signal using a first latch based on timing of the first feedback clock signal to generate first information, sampling the input clock signal using a second latch based on timing of a second feedback clock signal to generate second information, and controlling the delay circuit based at least on one of the first and second information to cause the data capture clock signal to be out of phase with the input clock signal by one-fourth of a period of the input data clock signal.

In Example 19, the subject matter of Example 18 may optionally include, wherein the second feedback clock signal is generated based on applying time delay to the first feedback clock signal using a delay chain, applying the time delay to the input clock signal includes applying a first time delay and a second time delay to the input clock signal, and a value of the second time delay is based on a value of the time delay applied to the first feedback clock.

In Example 20, the subject matter of Example 18 may optionally include, further comprising aligning an edge of the first feedback clock signal with a first edge of the input clock signal during an operation of causing the data capture clock signal to be out of phase with the input clock signal, and aligning an edge of the second feedback clock signal with a second edge of the input clock signal during the operation of causing the data capture clock signal to be out of phase with the input clock signal.

In Example 21, the subject matter of Example 20 optionally include, further comprising causing an edge of the second feedback clock signal to be aligned with an edge of the input clock signal after each of the first and second feedback clock signals are out of phase with the input clock signal.

In Example 22, the subject matter of Example 20 may optionally include, further comprising adjusting the time delay applied to the input clock signal based on timing relationship between the input clock signal and the second feedback clock signal.

Example 23 includes subject matter (such as a device, an electronic apparatus (e.g., circuit, electronic system, or both), or machine) including means for performing any of the methods of examples 18-22.

The subject matter of Example 1 through Example 23 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a data path to receive data information based on timing of a data capture clock signal;
a clock path including a delay circuit to apply a time delay to an input clock signal at a node and generate a delayed clock signal;
a clock tree circuit to provide the data capture clock signal and a feedback clock signal based on the delayed clock signal;
circuitry including latches to sample the input clock signal based on timing of the feedback clock signal and provide first sampled information and second sampled information, the latches including a first latch and a second latch, the first latch including an input node coupled to the node to provide the first sampled information, and the second latch including an input node coupled to the node to provide the second sampled information; and
a controller to control the delay circuit based on the first sampled information and the second sampled information in order to cause the data capture clock signal to be out of phase with the input clock signal by one-fourth of a period of the input clock signal.

2. An apparatus comprising:
a data path to receive data information based on timing of a data capture clock signal;
a clock path including a delay circuit to apply a time delay to an input clock signal and generate a delayed clock signal;
a clock tree circuit to provide the data capture clock signal and a feedback clock signal based on the delayed clock signal;
circuitry including latches to sample the input clock signal based on timing of the feedback clock signal and provide sampled information; and
a controller to control the delay circuit based on the sampled information in order to cause the data capture clock signal to be out of phase with the input clock signal by one-fourth of a period of the input clock signal, wherein the feedback clock signal is a first feedback clock signal, and the latches include a first latch to sample the input clock signal based on timing of the first feedback clock signal and provide a first portion of the sampled information, and a second latch to sample the input clock signal based on timing of a second feedback clock signal and provide a second portion of the sampled information.

3. The apparatus of claim 2, wherein the circuitry includes a delay chain to delay the first feedback clock signal by an amount of time delay to generate the second feedback clock signal.

4. The apparatus of claim 2, wherein the controller is to cause each of the first and second feedback clock signals to be out of phase with the input clock signal by one-fourth of the period of the input clock signal during an operation of causing the data capture clock signal to be out of phase with the input clock signal.

5. The apparatus of claim 2, wherein the controller is to align an edge of the second feedback clock signal with an edge of the input clock signal after the controller causes each of the first and second feedback clock signals to be out of phase with the input clock signal.

6. The apparatus of claim 5, wherein the controller is to adjust an amount of time delay applied to the input clock signal on the clock path based on value of the second portion of the sampled information.

7. The apparatus of claim 2, wherein the controller is to perform an operation to align an edge of the first feedback clock signal with a first edge of the input clock signal during an operation of causing the data capture clock signal to be out of phase with the input clock signal, and to align an edge of the second feedback clock signal with a second edge of the input clock signal during the operation of causing the data capture clock signal to be out of phase with the input clock signal.

8. An apparatus comprising:
a first node to receive data information;
a second node to receive an input clock signal;
a data path including a latch, the latch including a first input node coupled to the first node, a second input node to receive a data capture clock signal, and an output node to provide bits of the data information;
a clock path including a delay circuit to apply a time delay to the input clock signal to generate a delayed clock signal;
a clock tree circuit to receive the delayed clock signal and provide the data capture clock signal and a first feedback clock signal;
a first latch having a first input node coupled to the second node, a second input node to receive the first feedback clock signal, and an output node;
a delay chain to apply a time delay to the first feedback clock signal and generate a second feedback clock signal;
a second latch having a first input node coupled to the second node, a second input node to receive the second feedback clock signal, and an output node; and
a controller to receive information from the output node of each of the first and second latches, and output nodes coupled to the delay circuit of the clock path and the delay chain.

9. The apparatus of claim 8, wherein the delay chain is a first delay chain, and the delay circuit includes a second delay chain, and the first and second delay chains include a same number of delay elements.

10. The apparatus of claim 8, wherein the controller includes a finite state machine to control the delay circuit based on first codes and to control the delay chain based on second codes.

11. The apparatus of claim 8, wherein the first, second, and third latches have a same structure.

12. The apparatus of claim 8, wherein the clock tree circuit includes a first number of buffers coupled between the delay circuit of the clock path and the second input node of the latch of the data path, a second number of buffers coupled between the delay circuit and the second input node of the second latch, and the number of the second buffers is the same as the number of the first buffers.

13. An apparatus comprising:
conductive lines on a circuit board;
a first device coupled to the conductive lines; and
a second device coupled to the conductive lines to receive data information and an input clock signal from the first device, the second device including:
a clock path including a delay circuit to apply a time delay to the input clock signal at a node and generate a delayed clock signal;
a clock tree circuit to provide a data capture clock signal and a first feedback clock signal based on the delayed clock signal;
a data path to receive bits of the data information based on timing of the data capture clock signal; and
a delay locked loop coupled to the clock tree circuit, the delay locked loop including a first strong arm latch having an input node coupled the node to sample the input clock signal based on timing of the feedback clock signal and provide a first sampled information, a second strong arm latch having an input node coupled the node to sample the input clock signal based on timing of a second feedback clock signal and provide a second sampled information, and a controller to control the delay circuit based on at least one of the first and second sampled information in order to cause the data capture clock signal to be out of phase with the input clock signal by one-fourth of a period of the input clock signal.

14. The apparatus of claim 13, wherein the conductive lines are part of source synchronous links.

15. The apparatus of claim 13, wherein the data path includes a strong arm latch to receive the bits of the data information.

16. An apparatus comprising:
conductive lines on a circuit board;
a first device coupled to the conductive lines; and
a second device coupled to the conductive lines to receive data information and an input clock signal from the first device, the second device including:
a clock path including a delay circuit to apply a time delay to the input clock signal and generate a delayed clock signal;
a clock tree circuit to provide a data capture clock signal and a first feedback clock signal based on the delayed clock signal;
a data path to receive bits of the data information based on timing of the data capture clock signal; and
a delay locked loop coupled to the clock tree circuit, the delay locked loop including a first strong arm latch to sample the input clock signal based on timing of the feedback clock signal and provide a first sampled information, a second strong arm latch to sample the input clock signal based on timing of a second feedback clock signal and provide a second sampled information, and a controller to control the delay circuit based on at least one of the first and second sampled information in order to cause the data capture clock signal to be out of phase with the input clock signal by one-fourth of a period of the input clock signal, wherein the controller is to perform an operation to align an edge of the first feedback clock signal with a rising edge of the input clock signal during an operation of causing the data capture clock signal to be out of phase with the input clock signal, and to align an edge of the second feedback clock signal with a falling edge of the input clock signal during an operation of causing the data capture clock signal to be out of phase with the input clock signal.

17. The apparatus of claim 16, wherein the edge of the first feedback clock signal includes a rising edge of the first feedback clock signal, and the edge of the second feedback clock signal includes a rising edge of the second feedback clock signal.

18. A method comprising:

receiving data information and an input clock signal, the input clock signal being edge-aligned with bits of the data information;

applying a time delay to the input clock signal using a delay circuit to generate a delayed clock signal;

generating a data capture clock signal and a feedback clock signal based on the delayed clock signal;

sampling the input clock signal using a first latch based on timing of the first feedback clock signal to generate first information;

sampling the input clock signal using a second latch based on timing of a second feedback clock signal to generate second information; and controlling the delay circuit based at least on one of the first and second information to cause the data capture clock signal to be out of phase with the input clock signal by one-fourth of a period of the input data clock signal, wherein the second feedback clock signal is generated based on applying time delay to the first feedback clock signal using a delay chain, applying the time delay to the input clock signal includes applying a first time delay and a second time delay to the input clock signal, and a value of the second time delay is based on a value of the time delay applied to the first feedback clock.

19. The method of claim 18, further comprising:

aligning an edge of the first feedback clock signal with a first edge of the input clock signal during an operation of causing the data capture clock signal to be out of phase with the input clock signal; and aligning an edge of the second feedback clock signal with a second edge of the input clock signal during the operation of causing the data capture clock signal to be out of phase with the input clock signal.

20. The method of claim 19, further comprising:

causing an edge of the second feedback clock signal to be aligned with an edge of the input clock signal after each of the first and second feedback clock signals are out of phase with the input clock signal.

21. The method of claim 19, further comprising:

adjusting the time delay applied to the input clock signal based on timing relationship between the input clock signal and the second feedback clock signal.

\* \* \* \* \*